US012326361B2

(12) United States Patent
Ren et al.

(10) Patent No.: US 12,326,361 B2
(45) Date of Patent: Jun. 10, 2025

(54) PHOTOSENSITIVE CIRCUIT STRUCTURE AND OPTICAL DEVICE

(71) Applicant: Hefei Visionox Technology Co., Ltd., Anhui (CN)

(72) Inventors: Qingrong Ren, Hefei (CN); Rubo Xing, Hefei (CN); Junfeng Li, Hefei (CN); Gang Wang, Hefei (CN); Shuang Cui, Hefei (CN); Haofeng Zhang, Hefei (CN); Rui Guo, Hefei (CN); Dandan Sun, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 219 days.

(21) Appl. No.: 18/362,124

(22) Filed: Jul. 31, 2023

(65) Prior Publication Data

US 2023/0400353 A1 Dec. 14, 2023

Related U.S. Application Data

(63) Continuation of application No. PCT/CN2022/115968, filed on Aug. 30, 2022.

(30) Foreign Application Priority Data

Dec. 24, 2021 (CN) .......................... 202111603737.9

(51) Int. Cl.
*G01J 1/44* (2006.01)
*G01T 1/20* (2006.01)

(52) U.S. Cl.
CPC ............ *G01J 1/44* (2013.01); *G01T 1/20184* (2020.05); *G01J 2001/446* (2013.01)

(58) Field of Classification Search
CPC .... G01J 1/44; G01J 2001/446; G01T 1/20184
See application file for complete search history.

(56) References Cited

U.S. PATENT DOCUMENTS 6,005,238 A 12/1999 Mei et al.
2012/0057152 A1* 3/2012 Eldesouki ............ H04N 25/773
356/226

(Continued)

FOREIGN PATENT DOCUMENTS

CN 101459757 A 6/2009
CN 103680409 A 3/2014

(Continued)

OTHER PUBLICATIONS

International Search Report and Written Opinion issued on Nov. 24, 2022, in corresponding International Patent Application No. PCT/CN2022/115968, 15 pages.

(Continued)

*Primary Examiner* — David P Porta
*Assistant Examiner* — Fani Polyzos Boosalis
(74) *Attorney, Agent, or Firm* — Maier & Maier, PLLC

(57) ABSTRACT

A photosensitive circuit structure and an optical device, where the photosensitive circuit structure includes a photosensitive unit, a signal amplification unit and a control unit; the photosensitive unit includes a photodiode and a reset transistor, the signal amplification unit includes an amplification transistor, and the control unit includes a control transistor; an input terminal, an output terminal and a control terminal of the reset transistor are electrically connected to a power supply terminal, a control terminal of the amplification transistor and a reset signal terminal, respectively; an input terminal and output terminal of the amplification transistor are electrically connected to the power supply terminal and an input terminal of the control transistor respectively, and a control terminal of the control transistor is connected to a signal control terminal.

20 Claims, 4 Drawing Sheets

(56) References Cited

U.S. PATENT DOCUMENTS

2019/0360863 A1* 11/2019 Tang .................. G01J 1/46
2020/0006412 A1    1/2020 Li et al.
2021/0264829 A1    8/2021 Takatori

FOREIGN PATENT DOCUMENTS

| CN | 105044955 A | 11/2015 |
| CN | 207217538 U | 4/2018 |
| CN | 108470742 A | 8/2018 |
| CN | 109215569 A | 1/2019 |
| CN | 110690227 A | 1/2020 |
| CN | 111526304 A | 8/2020 |
| CN | 112071277 A | 12/2020 |
| CN | 112333404 A | 2/2021 |
| CN | 113013189 A | 6/2021 |
| CN | 113014837 A | 6/2021 |
| CN | 113225499 A | 8/2021 |
| CN | 114363542 A | 4/2022 |

OTHER PUBLICATIONS

Office Action issued on Oct. 28, 2023, in corresponding Chinese Application No. 202111603737.9, 16 pages.

* cited by examiner

PHOTOSENSITIVE CIRCUIT STRUCTURE AND OPTICAL DEVICE

CROSS-REFERENCE TO RELATED APPLICATIONS

The present application is a continuation of International Application No. PCT/CN2022/115968, filed on Aug. 30, 2022, which claims priority to Chinese Patent Application No. 202111603737.9, entitled with "PHOTOSENSITIVE CIRCUIT STRUCTURE AND OPTICAL DEVICE", and filed with China National Intellectual Property Administration on Dec. 24, 2021. The disclosures of the aforementioned applications are hereby incorporated by reference in their entireties.

TECHNICAL FIELD

The present application relates to the technical field of semiconductor, and in particular to a photosensitive circuit structure and an optical device.

BACKGROUND

With the development of semiconductor technology, X-ray flat panel detector is widely used in medical testing, security inspection and industrial production. For the X-Ray flat panel detector, a transistor array technology is used to form a pixel array on a substrate, and a coating that may convert X-rays into visible light, such as a fluorescent film or a flash film, is disposed on the pixel array. In the related arts, each pixel of the X-Ray flat panel detector includes a photoelectric conversion unit and a transistor switch. In specific applications, X-rays are received by the X-Ray flat panel detector after passing through the irradiated object and are converted into an image output.

However, the image quality of the X-Ray flat panel detector still needs to be further improved, which is also an important task of ongoing research in the industry.

SUMMARY

Embodiments of the present application provide a photosensitive circuit structure and an optical device, which may reduce the noise of the photosensitive circuit structure and improve the signal-to-noise ratio, thereby improving the performance of the optical device.

In a first aspect, an embodiment of the present application provide a photosensitive circuit structure, including a photosensitive unit, a signal amplification unit and a control unit; where the photosensitive unit includes a photodiode and a reset transistor, the signal amplification unit includes an amplification transistor, and the control unit includes a control transistor; an input terminal of the reset transistor is electrically connected to a power supply terminal, an output terminal of the reset transistor is electrically connected to a control terminal of the amplification transistor, and a control terminal of the reset transistor is electrically connected to a reset signal terminal; an input terminal of the amplification transistor is electrically connected to the power supply terminal, an output terminal of the amplification transistor is electrically connected to an input terminal of the control transistor, and a control terminal of the amplification transistor is electrically connected to a signal control terminal; a drain current of the reset transistor is smaller than a drain current of the amplification transistor, and a drain current of the control transistor is smaller than the drain current of the amplification transistor; and, a carrier mobility of the reset transistor is smaller than a carrier mobility of the amplification transistor, and the carrier mobility of the reset transistor is smaller than a carrier mobility of the control transistor. The photosensitive circuit structure provided by this embodiment of the present application includes a photosensitive unit, a signal amplification unit and a control unit, where the photosensitive unit includes a photodiode and a reset transistor, the signal amplification unit includes an amplification transistor, and the control unit includes a control transistor. By setting an input terminal of the reset transistor to be electrically connected to a power supply terminal, an output terminal of the reset transistor to be electrically connected to a control terminal of the amplification transistor, and a control terminal of the reset transistor to be electrically connected to a reset signal terminal, and by setting an input terminal of the amplification transistor to be electrically connected to the power supply terminal, an output terminal of the amplification transistor to be electrically connected to an input terminal of the control transistor, and a control terminal of the control transistor to be electrically connected to a signal control terminal, the photosensitive unit may convert an optical signal into an electrical signal, and the electrical signal may control the signal amplification unit to transmit the electrical signal at the power supply terminal to the output terminal of the control unit, thereby realizing the function of controlling the photosensitive circuit structure.

By setting a drain current of the reset transistor to be smaller than a drain current of the amplification transistor and a drain current of the control transistor to be smaller than the drain current of the amplification transistor, the drain current in the photosensitive circuit structure is effectively reduced, and the signal-to-noise ratio of the photosensitive circuit structure is improved. By setting a carrier mobility of the reset transistor to be smaller than a carrier mobility of the amplification transistor and the carrier mobility of the reset transistor to be smaller than a carrier mobility of the control transistor, the signal response speed of the photosensitive circuit structure may be enhanced, so that the working performance of the photosensitive circuit structure is improved.

In one possible implementation of the photosensitive circuit structure described above, an anode of the photodiode is electrically connected to a reverse bias voltage terminal, and a cathode of the photodiode is electrically connected between the output terminal of the reset transistor and the control terminal of the amplification transistor.

Such a setting may make the use of the photodiode to convert an optical signal into an electrical signal, meanwhile the signal is reverse biased to the photodiode through the reverse bias voltage terminal, thereby adjusting the different working processes of the photodiode and ensuring its working performance.

In one possible implementation of the photosensitive circuit structure described above, the photosensitive unit includes a storage capacitor, a first pole of the storage capacitor is electrically connected to the anode of the photodiode, and a second pole of the storage capacitor is electrically connected to the cathode of the photodiode.

Such a configuration may make the use of the storage capacitor to store the electrical signal generated by the photodiode or to provide a buffer electrical signal to the photodiode, thereby being conducive to ensuring the stability of the electrical signal transmitted to the control terminal of the signal amplification unit.

In one possible implementation of the photosensitive circuit structure described above, the photosensitive circuit structure further includes an operational amplification unit, where the output terminal of the control unit is electrically connected to an input terminal of the operational amplification unit.

The operational amplification unit is configured to process the electrical signal output from the output terminal of the control unit for subsequent application in other components of the optical device.

In one possible implementation of the photosensitive circuit structure described above, the photosensitive circuit structure further includes a voltage division unit, an input terminal of the voltage division unit is electrically connected between the output terminal of the control unit and the input terminal of the operational amplification unit, and an output terminal of the voltage division unit is electrically connected to the ground.

The voltage division unit may regulate the current in the circuit to protect the safety of the photosensitive circuit structure and of the circuit of the operational amplifier unit.

In one possible implementation of the photosensitive circuit structure described above, the reset transistor is a metal oxide transistor or an amorphous silicon transistor; the amplification transistor is any one of a low-temperature polysilicon transistor, a high-mobility metal oxide transistor, a silicon carbide transistor and a carbon nanotube transistor; and the control transistor is any one of a N-type high-mobility metal oxide transistor, a P-type low-temperature polysilicon transistor and a P-type carbon nanotube transistor.

Such a setting is conducive to reducing the drain current of the reset transistor, ensuring that the drain current of the reset transistor is smaller than that of the amplifier transistor, reducing the signal energy loss in the process of converting an optical signal into an electrical signal, and improving the signal-to-noise ratio of the photosensitive circuit structure.

In one possible implementation of the photosensitive circuit structure described above, an active layer of the reset transistor includes indium gallium zinc oxide and/or indium tin zinc oxide; and an active layer of the amplification transistor and/or an active layer of the control transistor each include at least one of ITZO (indium tin zinc oxide), IGXO (indium gallium X oxide), and polycrystalline IGZO (indium gallium zinc oxide), where X is a copper-aluminum alloy.

Such a setting is further conducive to reducing the drain current of the reset transistor, ensuring that the drain current of the reset transistor is smaller than those of the amplifier transistor and of the control transistor, reducing the signal energy loss in the process of converting an optical signal into an electrical signal, and improving the signal-to-noise ratio of the photosensitive circuit structure.

In one possible implementation of the photosensitive circuit structure described above, the photosensitive circuit structure includes at least two buffer layers; at least two of three active layers respectively adopted in the reset transistor, the amplification transistor and the control transistor are different from each other, and are respectively located on the at least two buffer layers.

Such a setting is not only conducive to better utilizing the space in an extension direction of the buffer layer, but also conducive to avoiding mutual interference among the transistors.

In one possible implementation of the photosensitive circuit structure described above, the at least two buffer layers include a first buffer layer and a second buffer layer, and the reset transistor is disposed on the first buffer layer; the second buffer layer is located at one side of the first buffer layer away from the reset transistor, and the control transistor and/or the amplification transistor is disposed on the second buffer layer; and, a distance is disposed between an orthogonal projection of the reset transistor on the second buffer layer and an orthogonal projection of the amplification transistor on the second buffer layer; or a distance is disposed between an orthogonal projection of the reset transistor on the second buffer layer and an orthogonal projection of the control transistor on the second buffer layer.

Such a setting may ensure that the reset transistor and the amplification transistor are separated from each other in structure, so that the mutual interference of the two structures is avoided, and the stability of the two structures is improved. The reset transistor and the control transistor may be ensured to be separated from each other in structure, so that the mutual interference of the two structures is avoided, thereby improving the stability of the two structures.

In one possible implementation of the photosensitive circuit structure described above, the reset transistor includes a first source, a first drain, a first gate and a first active layer disposed on the first buffer layer; the first source and the first drain are each electrically connected to the first active layer; one of the first source and the first drain is an input terminal of the reset transistor, and the other one of the first source and the first drain is an output terminal of the reset transistor. The cathode of the photodiode is electrically connected to the other one of the first source and the first drain. A first gate insulating layer is disposed between the first gate and the first active layer, and the first gate may control on-state or off-state of the first source and the first drain. Where, sides of the first active layer and of the first gate far away from the first buffer layer are both provided with an interlayer dielectric layer, the interlayer dielectric layer is provided with a first groove and a second groove, which are disposed at an interval along an extension direction of the first buffer layer, and the first groove and the second groove respectively expose a source region and a drain region of the first active layer; at least part of one of the first source and the first drain is located in the first groove and is electrically connected to a source region of the first active layer, and at least part of the other one of the first source and the first drain is located in the second groove and is electrically connected to a drain region of the first active layer.

Such a setting may ensure the structural integrity of the reset transistor and improves the working stability of the reset transistor.

In one possible implementation of the photosensitive circuit structure described above, the control transistor and/or the amplification transistor includes a second source, a second drain, a second gate, and a second active layer disposed on the second buffer layer; both the second source and the second drain are electrically connected to the second active layer, one of the second source and the second drain is an input terminal of the control transistor and/or the amplification transistor, and the other of the second source and the second drain is an output terminal of the control transistor and/or the amplification transistor; and a second gate insulating layer is disposed between the second gate and a second active layer.

Where, the second gate insulating layer covers one side of the second active layer far away from the second buffer layer; the first buffer layer covers one side of the second gate insulating layer far away from the second buffer layer; the interlayer dielectric layer covers one side of the first buffer layer far away from the second buffer layer; one side of the interlayer dielectric layer far away from the second buffer layer is further provided with a first passivation layer, and the first passivation layer covers sides of the first source and of the first drain far away from the first buffer layer. The first passivation layer may improve the protection effect on the first source and the first drain.

A third groove and a fourth groove are disposed at one side of the second active layer away from the second buffer layer at an interval, both the third groove and the fourth groove simultaneously penetrate through the first passivation layer, the interlayer dielectric layer, the first buffer layer and the second gate insulating layer, and respectively expose a source region and a drain region of the second active layer; at least a portion of one of the second source and the second drain is located in the third groove and is electrically connected to the source region of the second active layer, and at least a portion of the other of the second source and the second drain is located in the fourth groove and is electrically connected to the drain region of the second active layer.

Such a setting may ensure the structural integrity of the control transistor and/or the amplification transistor and improve the working stability of the reset transistor.

In one possible implementation of the photosensitive circuit structure described above, the photodiode is disposed on one side of the interlayer dielectric layer far away from the first buffer layer, and a light guiding layer is disposed on one side of the photodiode far away from the first buffer layer. Such a setting may improve the light receiving amount of the photodiode.

In one possible implementation of the photosensitive circuit structure described above, a planarization layer and a second passivation layer are disposed in sequence on one side of the first passivation layer far away from the first buffer layer, the planarization layer covers the second source and the second drain, and the second passivation layer covers one side of the light guiding layer far away from the first buffer layer. Such a setting may improve the protection effect on the photosensitive circuit structure.

In a second aspect, an embodiment of the present application provides an optical device, including a substrate and a plurality of photosensitive circuit structures as described above, where the plurality of photosensitive circuit structures are disposed on the substrate in an array. The optical device provided by this embodiment of the application includes a substrate and a plurality of photosensitive circuit structures, where the plurality of photosensitive circuit structures are disposed on the substrate in an array, so that the performance of the optical device is improved. Where, the photosensitive circuit structure includes a photosensitive unit, a signal amplification unit and a control unit. By setting an input terminal of the photosensitive unit to be electrically connected to a power supply terminal and an output terminal of the photosensitive unit to be electrically connected to a control terminal of the signal amplification unit, and by setting an input terminal of the signal amplification unit to be electrically connected to the power supply terminal and an output terminal of the signal amplification unit to be electrically connected to an input terminal of control unit, the photosensitive unit may convert an optical signal into an electrical signal, and the electrical signal may control the signal amplification unit to output the electrical signal at the power supply terminal to the control unit, finally outputting under the control of the control unit, thereby realizing the function of controlling the photosensitive circuit structure.

Specifically, the drain current of the reset transistor of the photosensitive unit and the drain current of the control transistor of the control unit are both set to be smaller than the drain current of the amplification transistor of the signal amplification unit, so that the drain current in the photosensitive circuit structure is effectively reduced, and the signal-to-noise ratio of the photosensitive circuit structure is improved. The signal response speed of the photosensitive circuit structure may be improved by setting the carrier mobility of the reset transistor to be smaller than the carrier mobility of the amplification transistor and the carrier mobility of the control transistor at the same time, thereby improving the working performance of the photosensitive circuit structure.

In addition to the technical problems solved by the embodiments of the present application, the technical features that constitute the technical solutions, and the beneficial effects brought by the technical features of these technical solutions described above, other technical problems that may be solved by the photosensitive circuit structure and optical device provided by embodiments of the present application, other technical features contained in the technical solutions, and the beneficial effects brought by these technical features, will be described in detail in the specific embodiments.

BRIEF DESCRIPTION OF DRAWINGS

To describe the technical solutions in embodiments of the present application or in the prior art more clearly, the accompanying drawings needed for describing the embodiments or the prior art will be introduced briefly below. Apparently, the accompanying drawings in the following description illustrate merely some embodiments of the present application, and persons of ordinary skill in the art may still derive other drawings from these accompanying drawings without creative effort.

DETAILED DESCRIPTION OF EMBODIMENTS

Figure 1:
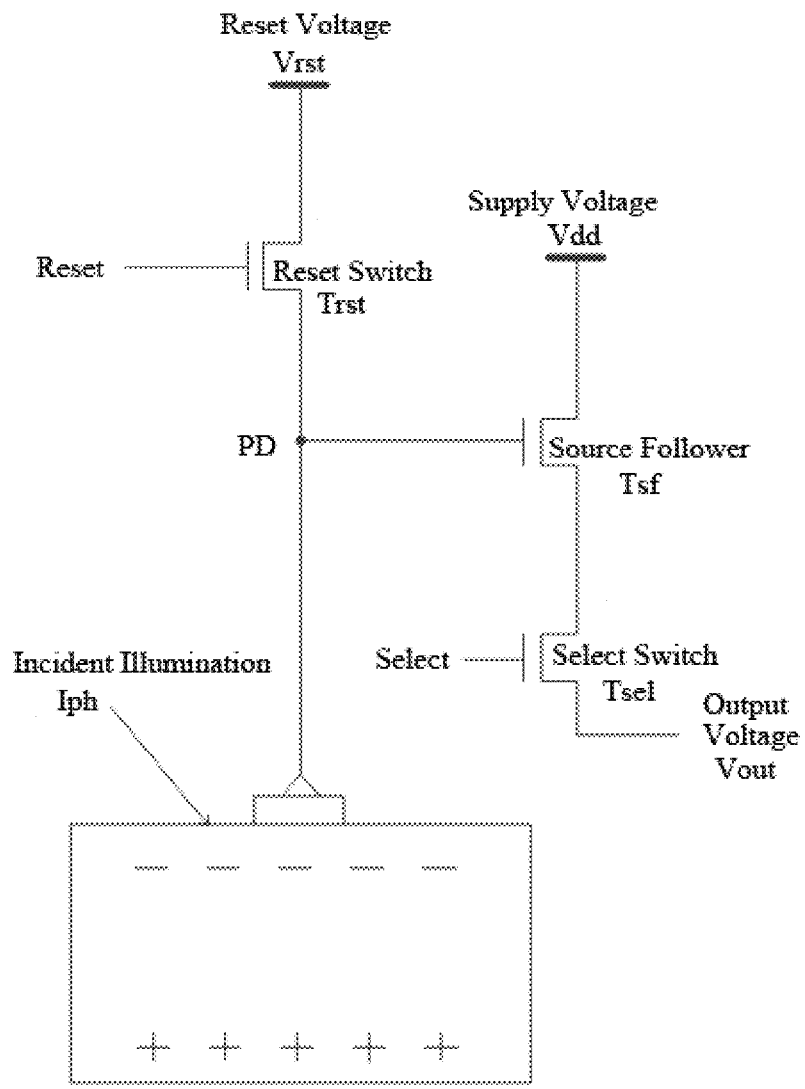
FIG. 1 is an equivalent circuit diagram of a photosensitive circuit structure provided in the related art.

In the related art, a plurality of transistors are generally included in a photosensitive circuit structure of a pixel of an image detector. An equivalent circuit diagram of a photosensitive circuit structure having three transistors and an operation timing diagram thereof are described in detail below. FIG. 1 is an equivalent circuit diagram of a photosensitive circuit structure provided in the related art, and FIG. 2 is an operation timing diagram of the equivalent circuit diagram of the photosensitive circuit structure in FIG.

1. Referring to FIG. 1, the equivalent circuit of the photosensitive circuit structure in the related art includes a reset switching transistor Trst, a source follower transistor Tsf, a selection switching transistor Tsel, and a photodiode PD.

An input terminal of the reset switching transistor Trst is electrically connected to a reset voltage Vrst, an output terminal of the reset switching transistor Trst is electrically connected to a cathode terminal of a photodiode PD, and a control terminal of the reset switching transistor Trst is electrically connected to a reset signal terminal. An input terminal of the source follower transistor Tsf is electrically connected to the power supply voltage Vdd, an output terminal of the source follower transistor Tsf is electrically connected to an input terminal of the selection switching transistor Tsel, and a control terminal of the source follower transistor Tsf is electrically connected to a cathode terminal of a photodiode PD. A control terminal of the selection switching transistor Tsel is electrically connected to a selection signal terminal, and an output terminal of the selection switching transistor Tsel outputs a voltage Vout.

Figure 2:
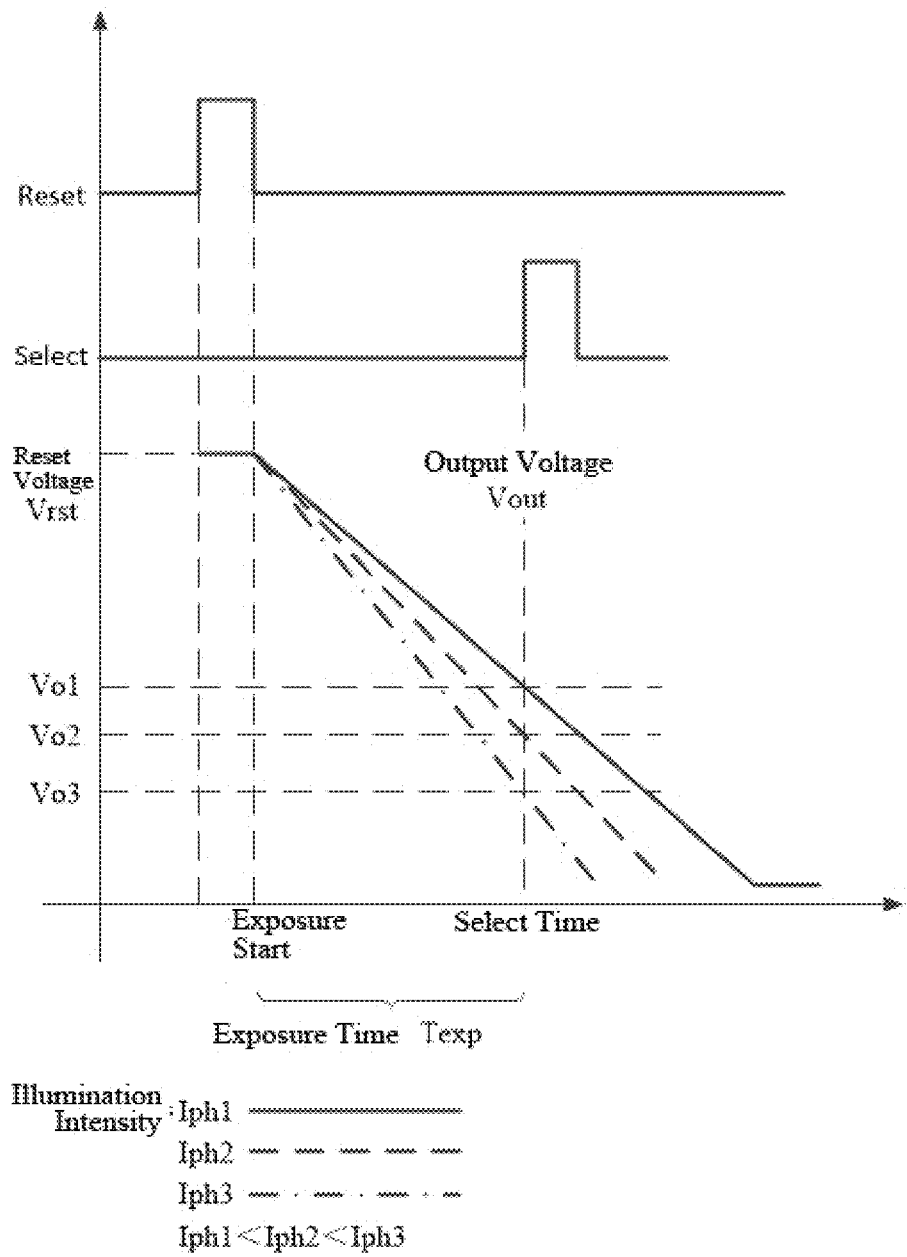
FIG. 2 is an operation timing diagram of the equivalent circuit diagram of the photosensitive circuit structure in FIG. 1.

As shown in FIG. 2, before the exposure starts, the reset switching transistor Trst is turned on by the reset signal Reset, the photodiode PD is reverse biased to the reset voltage Vrst, which charges the PN junction capacitor of the photodiode PD, and the charge quantity Qrst for charging satisfies the following relationship:

$$Qrst = CPD \cdot Vrst \quad \text{Equation 1}$$

Where, CPD in Equation 1 is the capacitance of the PN junction capacitor. After the reset switching transistor Trst has finished charging, it is turned off by the reset signal Reset, so that the photodiode PD node (i.e., the cathode terminal of the photodiode PD) is in a suspterminaled state. At this time, when the incident illumination intensity Iph is equal to 0, the reset voltage Vrst and the charge quantity Qrst of the photodiode PD are maintained on the PN junction capacitor.

At the beginning of exposure, when incident light irradiates the PN junction of the photodiode, the photon is excited to generate electron-hole pairs in the PN junction, so that the charges on the PN junction capacitor are recombined, the charge quantity QPD for the PN junction capacitor begins to decrease from the Qrst value, and the voltage VPD of the photodiode PD begins to decrease from the Vrst value. When the photodiode PD is irradiated with different light intensities Iph, the charge quantity QPD of the PN junction capacitor decreases at different rates, and the voltage VPD of the photodiode PD also decreases at different rates. The voltage VPD of the photodiode PD is converted into the output voltage Vout through the source follower transistor Tsf.

Under irradiation on the photodiode PD with different illumination intensity Iph, after the same exposure time Texp, more photo-generated carriers are generated on the PN junction under higher illumination intensity, so that after the charges on the PN junction capacitor are recombined, the charge quantity QPD is lower and the voltage VPD of the photodiode PD is also lower. Therefore, when the illumination intensity satisfies Iph1<Iph2<Iph3, accordingly, the charge quantity of the PN junction capacitor satisfies QPD1>QPD2>QPD3, the voltage of the photodiode PD satisfies VPD1>VPD2>VPD3, and the voltage output through the source follower transistor Tsf from the photodiode PD voltage satisfies Vo1>Vo2>Vo3. Here, the voltage gain of the source follower transistor Tsf is slightly smaller than 1. Where, the time from the terminaling of the reset signal (Reset) to the beginning of the selection signal (Select) is the actual exposure time Texp of the photodiode PD.

In the above photosensitive circuit structure, the reset switching transistor Trst, the source follower transistor Tsf, and the selection switching transistor Tsel are generally polysilicon transistors. Since the drain current of the polysilicon transistor switch is relatively large, the shot noise of the polysilicon transistor in the photosensitive circuit structure is relatively large, where the shot noise satisfies the following relationship:

$$\sigma_{TFT\text{-}shot} = \text{sqrt}(I_{TFT\text{-}off} * \tau_{FT}) \quad \text{Equation 2}$$

Where, in Equation 2, $\sigma_{TFT\text{-}shot}$ is a shot noise, $I_{TFT\text{-}off}$ is a drain current of a transistor, and $\tau_{FT}$ is an integration time. It may be seen that the greater the drain current is, the greater the shot noise is.

The drain current may be understood as a current flowing between the source and the drain of a transistor in the off-state. For the reset switching transistor Trst, it controls the reverse bias process of the photodiode PD. So if the drain current at the reset switching transistor Trst is large, it will seriously affect the output of the electrical signal of the photodiode PD after photoelectric conversion, resulting in low energy of the output electrical signal, thereby reducing the signal-to-noise ratio of the photosensitive circuit structure. Therefore, when the photosensitive circuit structure is applied to the image detector, the image signal output from the image detector is affected by the noise signal in the photosensitive circuit structure, so that the quality of the output image is also reduced.

In order to solve the above technical problem, embodiments of the present application provide a photosensitive circuit structure and an optical device, where the photosensitive circuit structure includes a photosensitive unit, a signal amplification unit, and a control unit; and the photosensitive unit includes a photodiode and a reset transistor, the signal amplification unit includes an amplification transistor, and the control unit includes a control transistor. An input terminal of the reset transistor is electrically connected to a power supply terminal, an output terminal of the reset transistor is electrically connected to a control terminal of the amplification transistor, and a control terminal of the reset transistor is electrically connected to a reset signal terminal; an input terminal of the amplification transistor is electrically connected to the power supply terminal, an output terminal of the amplification transistor is electrically connected to an input terminal of the control transistor, and a control terminal of the amplification transistor is electrically connected to a signal control terminal, so that the photosensitive unit may convert an optical signal into an electrical signal, and the electrical signal may control the signal amplification unit to transmit the electrical signal at the power supply terminal to the control output terminal of the control unit, thereby realizing the function of controlling the photosensitive circuit structure.

By setting a drain current of the reset transistor to be smaller than a drain current of the amplification transistor and a drain current of the control transistor to be smaller than the drain current of the amplification transistor, drain current in the photosensitive circuit structure is effectively reduced, and the signal-to-noise ratio of the photosensitive circuit structure is improved. Meanwhile, by setting a carrier mobility of the reset transistor to be smaller than a carrier mobility of the amplification transistor and the carrier mobility of the reset transistor to be smaller than a carrier mobility of the control transistor, the signal response speed of the photosensitive circuit structure may be enhanced, so that the working performance of the photosensitive circuit structure is improved.

To make the objectives, technical solutions, and advantages of embodiments of the present application clearer, the following clearly and comprehensively describes the technical solutions in embodiments of the present application with reference to the accompanying drawings in embodiments of the present application. Apparently, the described embodiments are merely a part rather than all of embodiments of the present application. All other embodiments obtained by persons of ordinary skill in the art based on embodiments of the present application without creative effort shall fall within the protection scope of the present application.

Figure 3:
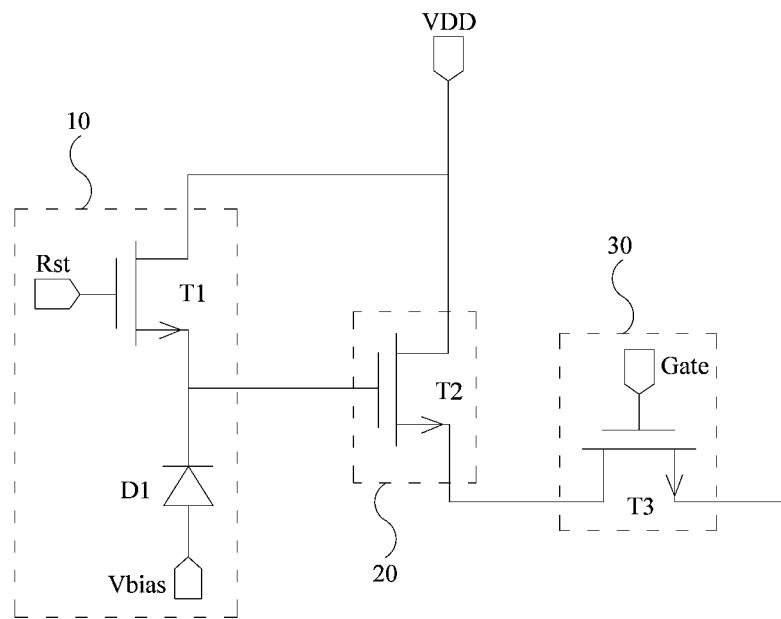
FIG. 3 is a first equivalent circuit diagram of a photosensitive circuit structure provided in an embodiment of the present application.
Figure 4:
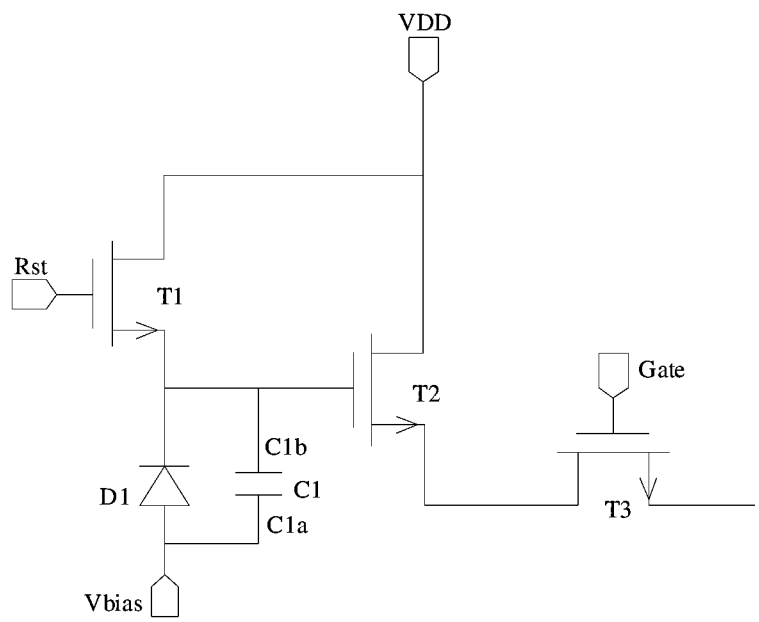
FIG. 4 is a second equivalent circuit diagram of a photosensitive circuit structure provided in an embodiment of the present application.
Figure 5:
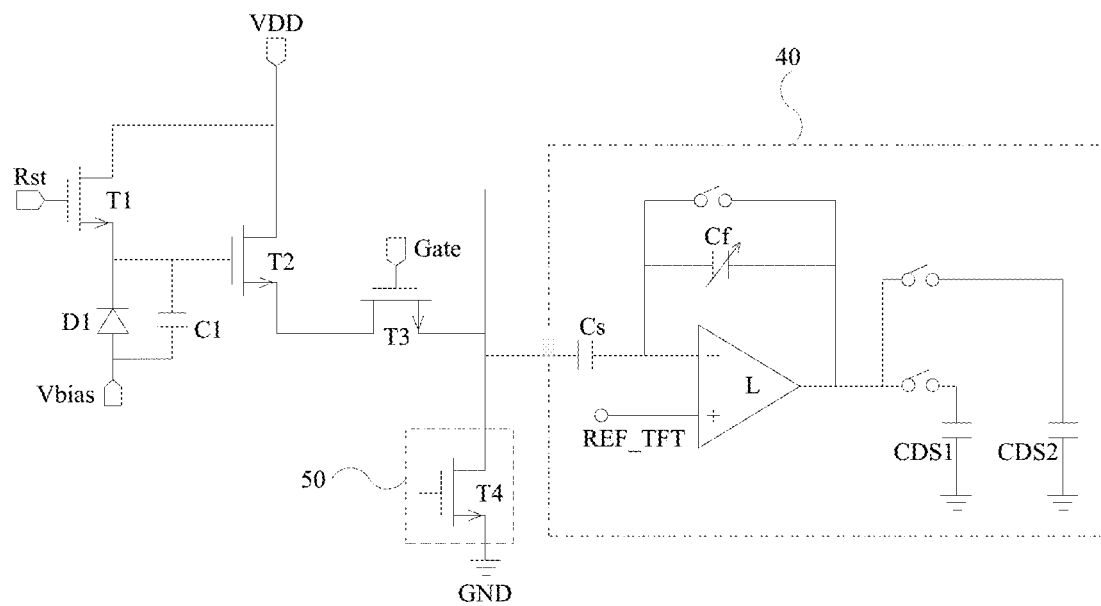
FIG. 5 is a third equivalent circuit diagram of a photosensitive circuit structure provided in an embodiment of the present application.
Figure 6:
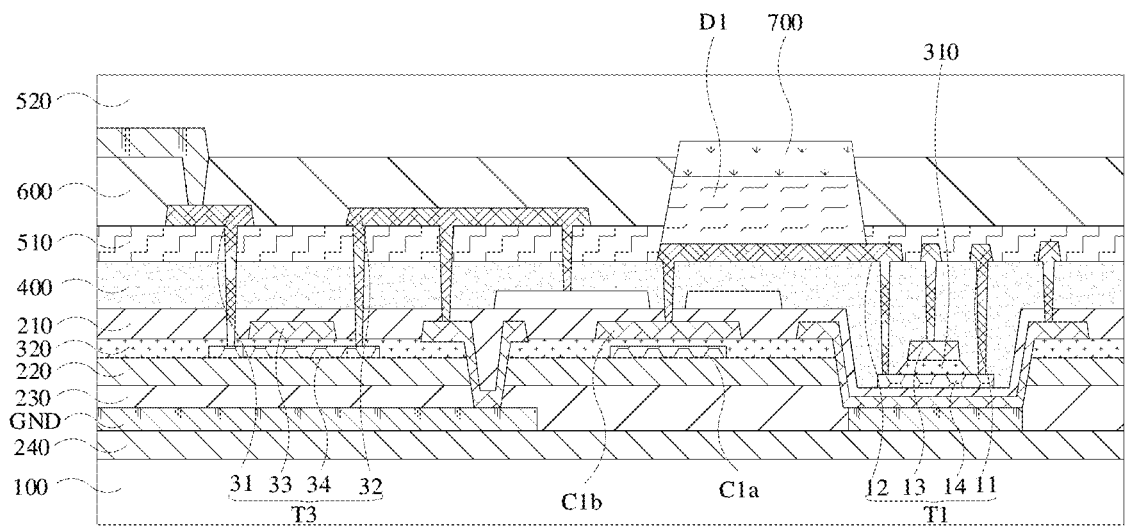
FIG. 6 is a schematic structural diagram of a reset transistor and a control transistor of a photosensitive circuit structure provided in an embodiment of the present application.

FIG. 3 is a first equivalent circuit diagram of a photosensitive circuit structure provided in an embodiment of the present application; FIG. 4 is a second equivalent circuit diagram of a photosensitive circuit structure provided in an embodiment of the present application; FIG. 5 is a third equivalent circuit diagram of a photosensitive circuit structure provided in an embodiment of the present application; and FIG. 6 is a schematic structural diagram of a reset transistor and a control transistor of a photosensitive circuit structure provided in an embodiment of the present application.

Referring to FIGS. 3 to 6, an embodiment of the present application provides a photosensitive circuit structure, including: a photosensitive unit 10, a signal amplification unit 20, and a control unit 30.

The input terminal of the photosensitive unit 10 is electrically connected to the power supply terminal VDD, and the output terminal of the photosensitive unit 10 is electrically connected to the control terminal of the signal amplification unit 20. The input terminal of the signal amplification unit 20 is electrically connected to the power supply terminal VDD, and the output terminal of the signal amplification unit 20 is electrically connected to the input terminal of the control unit 30.

The photosensitive circuit structure may be disposed on the substrate 100, and the material of the substrate 100 may be monocrystalline silicon, polycrystalline silicon, amorphous silicon, silicon germanium compound, silicon-on-insulator (SOI) or the like; it may also be an organic or inorganic film layer, such as Polyimide (PI); and it may also be other materials known to those skilled in the art. The substrate 100 may provide a support base for the remaining structural layers disposed on the substrate 100. The electrical connection between the photosensitive unit 10, the signal amplification unit 20, the control unit 30 and the power supply terminal VDD may be realized by inserting metal wire.

As shown in FIG. 3, a reset transistor T1 is provided in the photosensitive unit 10, an amplification transistor T2 is provided in the signal amplification unit 20, and a control transistor T3 is provided in the control unit 30. In the photosensitive circuit structure, an input terminal of the reset transistor T1 is electrically connected to a power supply terminal VDD, an output terminal of the reset transistor T1 is electrically connected to a control terminal of the amplification transistor T2, and a control terminal of the reset transistor T1 is electrically connected to a reset signal terminal Rst. An input terminal of the amplification transistor T2 is electrically connected to the power supply terminal VDD, an output terminal of the amplification transistor T2 is electrically connected to an input terminal of a control transistor T3, and a control terminal of the control transistor T3 is electrically coupled to a signal control terminal Gate.

Exemplarily, the input terminal of the reset transistor T1 and the input terminal of the amplification transistor T2 may also be connected to different voltage terminals as in the related art described above. In this embodiment, both of them are connected to the power supply terminal VDD at the same time, which may effectively simplify the photosensitive circuit structure.

The working process of the photosensitive circuit structure provided in this embodiment may be as follows.

Before the photosensitive unit 10 is irradiated by light, the reset transistor T1 in the photosensitive unit 10 is turned on to control the power supply terminal VDD to input an electrical signal to the photosensitive unit 10, and is turned off when the photosensitive unit 10 has an initial electrical signal. When the photosensitive unit 10 is irradiated by light, the photosensitive unit 10 may convert the received optical signal into an electrical signal, and the electrical signal is recombined with the initial electrical signal of the photosensitive unit 10 and then is transmitted to the control terminal of the amplification transistor T2 of the signal amplification unit 20, so that the output terminal of the amplification transistor T2 may follow the electrical signal and output a corresponding following electrical signal. The following electrical signal may be transmitted to the input terminal of the control transistor T3, and the purpose of controlling on-off of the control transistor T3 may be achieved by controlling the control signal input to the control terminal of the controlling transistor T3. When the control transistor T3 is turned on, the following electrical signal may be transmitted to the output terminal of the control transistor T3.

It should be emphasized that, in this embodiment, the drain current of the reset transistor T1 is smaller than the drain current of the amplification transistor T2, and the drain current of the control transistor T3 is also smaller than the drain current of the amplification transistor T2. Exemplarily, the drain current of the reset transistor T1 is smaller than the drain current of the control transistor T3.

For the reset transistor T1, the photosensitive unit 10 is to recombine the electrical signal converted from the optical signal with the initial electrical signal to obtain a composite electrical signal. In order to ensure the authenticity of the composite electrical signal, it is necessary to reduce the noise in the photosensitive unit 10, and the noise is positively correlated with the drain current of the transistor. Therefore, the authenticity of the composite electrical signal may be ensured by reducing the drain current of the reset transistor T1 in the photosensitive unit 10, which is conducive to ensuring the final outputting of an electrical signal with a high signal-to-noise ratio after the composite electric signal passes through the subsequent signal amplification unit 20 and the control unit 30.

For the control transistor T3, the control transistor T3 needs to output the following electrical signal transmitted from the signal amplification unit 20 to the input terminal of the control transistors T3. The smaller the drain current of the control transistors T3 is, the smaller the noise doped in the electrical signal output from the control transistors T3 is. Therefore, the signal-to-noise ratio of the output electrical signal may be further improved by reducing the drain current of the control transistor T3.

As an implementation, in order to improve the response speed of the photosensitive circuit structure, the carrier mobility of the reset transistor T1 may be set to be smaller than the carrier mobility of the amplification transistor T2;

and at the same time, the carrier mobility of the reset transistor T1 may be set to be smaller than the carrier mobility of the control transistor T3. The amplification transistor T2 may generate a following electrical signal by following the composite electrical signal, and transmit the following electrical signal to the control transistor T3. The control transistor T3 may control the output process of the following electrical signal. Therefore, increasing the carrier mobility of the amplification transistor T2 and the controlling transistor T3 can effectively improve the output efficiency of the electrical signal of the photosensitive circuit structure, thereby enhancing the working performance of the photosensitive circuit structure. The carrier mobility of the amplification transistor T2 may be greater than that of the control transistor T3; alternatively, the carrier mobility of the amplification transistor T2 may be smaller than that of the control transistor T3.

Referring to FIGS. 3 to 5, in an implementation provided by an embodiment of the present application, the photosensitive unit 10 may include a photodiode D1, an anode of the photodiode D1 is electrically connected to a reverse bias voltage terminal Vbias, and a cathode of the photodiode D1 is electrically connected between an output terminal of the reset transistor T1 and a control terminal of the amplification transistor T2.

Such a setting may provide a reset signal to the photosensitive unit 10 through the reset transistor T1 during the reset process, so as to turn on the power supply terminal VDD and the photodiode D1, thereby realizing the initial power-on state of the photodiode D1. In the reverse bias process, a reverse bias signal is provided to the photodiode D1 through the reverse bias voltage terminal Vbias, so as to implement a reverse bias process of the photodiode D1, thereby adjusting different working sates of the photodiode D1 and ensuring the working performance of the photosensitive unit 10.

The reset signal sent by the reset signal terminal Rst may turn on the reset transistor T1 by controlling the control terminal of the reset transistor T1, so that the electrical signal of the power supply terminal VDD is transmitted to the control terminal of the amplification transistor T2.

Referring to FIG. 6, the cathode of the photodiode D1 may directly abut to one of the source and the drain of the reset transistor T1 to achieve an electrical connection between the two. Of course, in some embodiments, there may be no relationship of abutting with each other among the reset transistor T1, the photodiode D1, the reset signal terminal Rst and the reverse bias voltage terminal Vbias, and the electrical connection among the above structures may also be realized by inserting metal wire, which is not limited in this embodiment.

The specific working process of the photosensitive unit 10 of the embodiment is described in detail below with reference to the photodiode D1.

First, in the initial power-on stage, the reset transistor T1 is turned on under the control of the reset signal terminal Rst, the power supply terminal VDD is electrically connected to the cathode side of the photodiode D1; and after a predetermined time, the reset signal terminal Rst controls the reset transistor T1 to be off. In this process, the node of the photodiode D1 connected to the output terminal of the reset transistor T1 obtains an initial voltage and then enters the working state.

Next, in the photoelectric conversion stage, the photodiode D1 generates a photocurrent and injects electrons into the cathode side of the photodiode D1 under illumination, so that the voltage at the cathode side of the photodiode D1 is continuously reduced. In the photoelectric conversion stage, the amount of voltage drop on the cathode side of the photodiode D1 is δ. Since the cathode side of the photodiode D1 is electrically connected to the control terminal of the amplification transistor T2 at the same time, the output voltage of the amplification transistor T2 decreases as the voltage at the cathode side of the photodiode D1 continues to decrease.

Then, in the electrical signal reading stage, after the photosensitive unit 10 has been exposed for a period of time, the control transistor T3 is turned on under the control of the signal control terminal Gate. The input terminal of the control transistor T3 and the output terminal of the amplification transistor T2 are electrically connected with each other and in an on-state, so as to obtain a voltage signal from the output terminal of the amplification transistor T2, and the voltage signal is output through the output terminal of the control transistor T3.

Since the variation of the photocurrent is positively correlated with the voltage variation at the cathode side of the photodiode D1, and the voltage variation amount δ at the cathode side of the photodiode D1 is positively correlated with the illumination intensity, as the illumination intensity is greater, the voltage variation amount δ at the cathode side of the photodiode D1 is greater, the voltage value at the cathode side of photodiode D1 is smaller, the output voltage value of the amplification transistor T2 is smaller and the voltage signal output from the control transistor T3 is smaller, so that the intensity of illumination irradiated on the photodiode D1 may be determined by detecting the magnitude of the voltage signal output from the control transistor T3.

In the working process of the above photodiode D1, there may be a reverse bias stage, which may be set between a plurality of photoelectric conversion stages according to users' requirements, so as to ensure the stability of the working performance of the photodiode D1. Since electrons are injected into the cathode side of the photodiode D1 for a long period, the photodiode D1 is in a biased state, which affects its photoelectric conversion process. Therefore, it needs to be adjusted for reverse bias. The specific process may be that a reverse bias voltage is provided to the anode side of the photodiode D1 through the reverse bias voltage terminal Vbias to eliminate the bias voltage in the photodiode D1 and maintain the efficient photoelectric conversion performance of the photodiode D1.

In order to further maintain the stable output of the electrical signal of the photosensitive unit referring to FIG. 4, in an implementation provided by an embodiment of the present application, the photosensitive unit 10 includes a storage capacitor C1, a first pole C1a of the storage capacitor C1 is electrically connected to the anode of the photodiode D1 and a second pole C1b of the storage capacitor C1 is electrically connected to the cathode of the photodiode D1. The storage capacitor C1 may be configured for storing an electrical signal generated by the photodiode D1 during illumination or providing a buffer electrical signal to the photodiode D1, which is conducive to ensuring that the electrical signal at the cathode side of the photodiode D1 may be stably output, so as to improve the control effect on the signal amplification unit 20.

As shown in FIG. 5, in an implementation provided by an embodiment of the present application, the photosensitive circuit structure further includes an operational amplification unit 40, and an output terminal of the control unit 30 is electrically connected to an input terminal of the operational amplification unit 40. The operational amplifier unit 40 includes an operational amplifier L, a capacitor Cs, an adjustable capacitor Cf and two correlated double sampling circuits CDS1 and CDS2. The output terminal of the control unit 30 is connected to an inverting input terminal of the operational amplifier L, a positive going input terminal of the operational amplifier L is connected to a reference input terminal REF_TFT, and the output terminal of the operational amplifier L is connected to the correlated double sampling circuits CDS1 and CDS2. The two poles of the adjustable capacitor Cf are respectively connected to the inverting input terminal of the operational amplifier L and the output terminal of the operational amplifier L. The operational amplification unit 40 may perform operational processing on the electrical signal output from the output terminal of the control unit 30, so as to generate a high-quality image subsequently.

In an implementation provided by an embodiment of the present application, the photosensitive circuit structure further includes a voltage division unit 50. Exemplarily, the voltage division unit 50 may include a transistor T4, a resistor, etc. This embodiment is illustrated by the example of the voltage division unit 50 being a transistor T4. The input terminal of the voltage division unit 50 is electrically connected between the output terminal of the control unit 30 and the input terminal of the operational amplification unit 40, and the output terminal of this voltage division unit 50 is electrically connected to the ground GND, so as to regulate the current in the circuit.

It should be noted that, in this embodiment, the photosensitive circuit structure having three transistors is taken as an example for explanation. In other embodiments, the photosensitive circuit structure may also include four transistors, five transistors, and seven transistors, and the setting method and principle thereof are similar to those of the photosensitive circuit structure in this embodiment, which will not be repeated here.

The specific structure of the photosensitive circuit structure will be described in detail with reference to FIG. 6. The photosensitive circuit structure may include at least two buffer layers, and at least two of three active layers respectively adopted in the reset transistor T1, the amplification transistor T2 and the control transistor T3 are different from each other, and are respectively located on the at least two buffer layers. Exemplarily, the photosensitive circuit structure may include two buffer layers, the reset transistor T1 may be located on one of the two buffer layers, and the amplification transistor T2 and the control transistor T3 may be located on the other buffer layer; or, the photosensitive circuit structure may include three buffer layers, and the reset transistor T1, the amplification transistor T2 and the control transistor T3 are respectively located on the three buffer layers.

The reset transistor T1 may be a metal oxide transistor or an amorphous silicon transistor. The amplification transistor T2 may be any one of a low temperature polysilicon transistor, a high mobility metal oxide transistor, a silicon carbide transistor and a carbon nanotube transistor. The control transistor T3 may be any one of an N-type high mobility metal oxide transistor, a P-type low temperature polysilicon transistor, and a P-type carbon nanotube transistor.

Exemplarily, both the amplification transistor T2 and the control transistor T3 may be polysilicon transistor. Since the polysilicon transistor has higher mobility, faster response speed and stronger resistance to optical interference, thereby not only helping to ensure the performance and reliability of the control transistor T3 and the amplification transistor T2, but also helping to ensure that the carrier mobility of the reset transistor T1 is smaller than the carrier mobility of the amplification transistor T2 and the carrier mobility of the control transistor T3.

In an implementation provided by an embodiment of the present application, at least two buffer layers include a first buffer layer 210 on which the reset transistor T1 is disposed, where the first buffer layer 210 is located above the substrate 100. Other structural layers may be disposed between the first buffer layer 210 and the substrate 100. The material of the first buffer layer 210 may be silicon oxide, silicon nitride, or other materials known to those skilled in the art. The reset transistor T1 includes one 11 of a first source and a first drain, the other 12 of the first source and the first drain, a first gate 13, and a first active layer 14 disposed on the first buffer layer 210. One 11 of the first source and the first drain is an input terminal of the reset transistor T1, and the other 12 of the first source and the first drain is an output terminal of the reset transistor T1. Both one 11 of the first source and the first drain and the other 12 of the first source and the first drain are both electrically connected to the first active layer 14. The first gate 13 may be set in lamination with the first active layer 14, and a first gate insulating layer 310 is disposed between the first gate 13 and the active layer 14. Controlling an electrical signal applied to the first gate 13 may allow the first active layer 14 between one 11 of the first source and the first drain and the other 12 of the first source and the first drain to be turned on or off. The material of the first gate insulating layer 310 may be silicon oxide or other materials known to those skilled in the art. In some embodiments, the reset transistor T1 is an N-type transistor, one 11 of the first source and the first drain is the first drain, and the other 12 of the first source and the first drain is the first source. In some embodiments, the reset transistor T1 is a P-type transistor, one 11 of the first source and the first drain is the first source, and the other 12 of the first source and the first drain is the first drain.

The first gate 13 may be set in lamination with the first active layer 14, including an implementation manner that the first active layer 14 is disposed between the first buffer layer 210 and the first gate 13, and an implementation manner that the first gate 13 is disposed between the first buffer layer 210 and the first active layer 14. The material of one 11 of the first source and the first drain and the other 12 of the first source and the first drain may include aluminum, titanium, or other materials known to those skilled in the art, and the material of the first gate 13 may be molybdenum or other materials known to those skilled in the art.

An interlayer dielectric layer 400 may be provided on one side of the first active layer 14 and one side of the first gate 13, which are away from the first buffer layer 210. A first groove and a second groove are provided in the interlayer dielectric layer 400 at an interval, and the first groove and the second groove expose the source region and the drain region of the first active layer 14, respectively. At least a portion of one 11 of the first source and the first drain is located in the first groove and is electrically connected to one of the source and the drain regions of the first active layer 14. At least a portion of the other 12 of the first source and the first drain is located in the second groove and is electrically connected to the other of the source and drain regions of the first active layer 14. In this way, the structural integrity of the reset transistor T1 may be ensured, improving the working stability thereof. The material of the interlayer dielectric layer 400 may be silicon oxide, silicon nitride, or other materials known to those skilled in the art.

Specifically, the first groove and the second groove are disposed at an interval along an extension direction of the first buffer layer 210, which may effectively avoid mutual interference in structure between the first groove and the second groove, and simultaneously avoid the problem that the electrical signal interference occurs during the operation of one 11 of the first source and the first drain in the first groove and the other 12 of the first source and the first drain in the second groove, thereby ensuring the operation stability of the reset transistor T1. The spacing distance of the first groove and the second groove is not limited in this embodiment.

When the reset transistor T1 is a metal oxide transistor, the active layer of the reset transistor T1 may include indium gallium zinc oxide and/or indium tin zinc oxide. That is, the first active layer 14 may be indium gallium zinc oxide, indium tin zinc oxide, or a combination of indium gallium zinc oxide and indium tin zinc oxide.

Since the shot noise of the reset transistor T1 is directly related to the drain current, and the indium gallium zinc oxide and the indium tin zinc oxide have the advantages of low off-state drain current and good uniformity, using the indium gallium zinc oxide and the indium tin zinc oxide as the active layer of the restore transistor T1 can reduce the drain current of the reset transistor T1 and decrease the signal energy loss in a process of converting an optical signal into an electrical signal, thereby being conducive to improving the signal-to-noise ratio of the reset transistor T1 and further being conducive to enhancing the performance of the photosensitive circuit structure. Moreover, the manufacturing cost of the indium gallium zinc oxide and the indium tin zinc oxide is low, thereby facilitating to save the cost of the photosensitive circuit structure.

Referring to FIG. 6 again, in an implementation provided by an embodiment of the present application, the at least two buffer layers further include a second buffer layer 220, which is located on one side of the first buffer layer 210 facing away from the reset transistor T1. The control transistor T3 and/or the amplification transistor T2 are disposed on the second buffer layer 220, and there is a distance between an orthogonal projection of the reset transistor T1 and an orthogonal projection of the amplification transistor T2 on the second buffer layer 220; or, there is a distance between the orthogonal projection of the reset transistor T1 and an orthogonal projection of the control transistor T3 on the second buffer layer 220.

Considering that the control transistor T3, the amplification transistor T2 and the reset transistor T1 respectively control the conduction of electrical signals at different parts in the photosensitive circuit structure, the control transistor T3 and the reset transistor T1 are structurally separated from each other. In this way, on one hand, the mutual interference in structure of the two may be effectively avoided and the manufacturing difficulty of the photosensitive circuit structure may be reduced, and on the other hand, the electrical signal interference during the use of the control transistor T3 and the reset transistor T1 may be avoided, thereby improving the stability of their structure and working performance. Alternatively, the amplification transistor T2 and the reset transistor T1 are structurally separated from each other, so that on one hand, the mutual interference of the structures of the two may be effectively avoided and the manufacturing difficulty of the photosensitive circuit structure may be reduced, and on the other hand, the electrical signal interference during the use of the amplification transistor T2 and the resetting transistor T1 may be avoided, thereby improving the stability of their structure and working performance.

The distance between the control transistor T3 and the reset transistor T1, or the distance between the amplification transistor T2 and the reset transistor T1 is not limited in this embodiment.

The specific structures of the control transistor T3 and the amplification transistor T2 in the photosensitive circuit structure may be the same. In FIG. 6, a transistor disposed on the second buffer layer 220 is the control transistor T3, and the amplification transistor T2 is not shown. This embodiment is described by taking the structure of the control transistor T3 as an example with reference to FIG. 6, and those skilled in the art may understand that the structure of the control transistor T3 described in this embodiment may also be the structure of the amplification transistor T2.

The control transistor T3 (the amplification transistor T2) includes one 31 of a second source and a second drain, the other 32 of the second source and the second drain, a second gate 33, and a second active layer 34 disposed on the second buffer layer 220. One 31 of the second source and the second drain is an input terminal of the control transistor T3 (the amplification transistor T2), the other 32 of the second source and the second drain is an output terminal of the control transistor T3 (the amplification transistor T2), and the second gate 33 is a control terminal of the control transistor T3 (the amplification transistor T2). One 31 of the second source and the second drain and the other 32 of the second source and the second drain are both electrically connected to the second active layer 34. The second gate 33 may be set in lamination with the second active layer 34, and a second gate insulating layer 320 is disposed between the second gate 33 and the first active layer 34. In some embodiments, the control transistor T3 (the amplification transistor T2) is an N-type transistor, one 31 of the second source and the second drain is a second drain, and the other 32 of the second source and the second drain is a second source. In some embodiments, the control transistor T3 (the amplification transistor T2) is a P-type transistor, one 31 of the second source and the second drain is a second source, and the other 32 of the second source and the second drain is a second drain.

The second gate 33 is set in lamination with the second active layer 34, including an implementation manner that the second active layer 34 is disposed between the second buffer layer 220 and the second gate 33, and an implementation manner that the second gate 33 is disposed between the second buffer layer 220 and the second active layer 34. The material of one 31 of the second source and the second drain and the other 32 of the second source and the second drain may include any one of molybdenum, neodymium, copper, aluminum and titanium, or other materials known to those skilled in the art. The material of a second gate 33 may be molybdenum or other materials known to those skilled in the art. The material of the second gate insulating layer 320 may be silicon oxide or other materials known to those skilled in the art.

Exemplarily, the second gate insulating layer 320 may cover one side of the second active layer 34 away from the second buffer layer 220. The first buffer layer 210 covers one side of the second gate insulating layer 320 away from the second buffer layer 220, the interlayer dielectric layer 400 covers one side of the first buffer layer 210 away from the second buffer layer 220, and the first passivation layer 510 is further disposed on one side of the interlayer dielectric layer 400 away from the second buffer layer 220.

The control transistor T3 (the amplification transistor T2) further includes a third groove and a fourth groove. Along an extension direction of the second buffer layer 220, the third groove and the fourth groove are disposed at an interval on one side of the second active layer 34 facing away from the second buffer layer 220. Each of the third groove and the fourth groove simultaneously penetrates through the first passivation layer 510, the interlayer dielectric layer 400, the first buffer layer 210 and the second gate insulating layer 320; and respectively exposes the source region and the drain region of the second active layer 34. At least a portion of one 31 of the second source and the second drain is located in the third groove and is electrically connected to one of the source region and the drain region of the second active layer 34; and at least a portion of the other 32 of the second source and the second drain is located in the fourth groove and is electrically connected to the other of the source region and the drain region of second active layer 34. The material of the interlayer dielectric layer 400 may be silicon oxide, silicon nitride, or other materials known to those skilled in the art.

Similarly to the first and second groove, the third and fourth groove are disposed at an interval along the extension direction of the second buffer layer 220, which may effectively avoid mutual interference in structure between the third groove and the fourth groove; and simultaneously avoid the problem of electrical signal interference during the operation of one 31 of the second source and the second drain in the third groove or the other 32 of the second source and the second drain in the fourth groove, thereby ensuring the working stability of the polysilicon transistor. The spacing distance of the third groove and the fourth groove is not limited in this embodiment.

Exemplarily, when the control transistor T3 works, referring to FIG. 5 and FIG. 6, one 31 of the second source and the second drain is connected to the output terminal of the amplification transistor T2, and the other 32 of the second source and the second drain outputs an electrical signal to the outside. Under the control the control signal terminal Gate, the second gate 33 allows one 31 of the second source and the second drain and the other 32 of the second source and the second drain to be electrically connected with each other and in an on-state, so that the electrical signal output from the amplification transistor T2 may be output from the output terminal of the control transistor T3. If the control transistor T3 is a high mobility metal oxide transistor, the active layer of the control transistor T3 may include at least one of ITZO, IGXO, and polycrystalline IGZO, where X is a copper-aluminum alloy. Exemplarily, the control transistor T3 may be an N-type metal oxide semiconductor field effect transistor with a relatively small drain current, so as to meet the requirements of the control transistor T3 on high mobility and low drain current, thereby being conducive to improving the performance of the photosensitive circuit structure.

Exemplarily, when the amplification transistor T2 works (the amplification transistor T2 is not shown in FIG. 6), one of the source and the drain of the amplification transistors T2 is connected to the power supply terminal VDD, the other of the source and the drain of the amplification transistors T2 is connected to the input terminal of the control transistor T3, and the gate of the amplification transistor T2 is connected to the cathode side of the photodiode D1. The electrical signal at the cathode side of the photodiode D1 may control the gate of the amplification transistor T2 to turn on the source and drain of the amplification transistor T2, and the electrical signal at the power supply terminal VDD may be transmitted to the other one of the source and the drain of the amplifier transistor T2. If the amplification transistor T2 is a high mobility metal oxide transistor, the active layer of the amplification transistor T2 may include at least one of ITZO, IGXO and polycrystalline IGZO, where X is a copper-aluminum alloy.

Referring to FIG. 6, in an implementation provided by an embodiment of the present application, the photodiode D1 is disposed on one side of the interlayer dielectric layer 400 away from the first buffer layer 210, and a cathode of the photodiode D1 is electrically connected to the other 12 of the first source and the first drain.

It should be noted that the photodiode D1 is located on one side of the interlayer dielectric layer 400 close to the other 12 of the first source and the first drain, so as to abut to the other 12 of the first source and the first drain to form an electrical connection therebetween. Meanwhile, the first pole C1$a$ of the storage capacitor C1 in the photosensitive circuit structure is located on one side of the second buffer layer 220 far away from the substrate 100; the second gate insulating layer 320 covers one side of the first pole C1$a$ far away from the substrate 100; and a second pole C1$b$ of the storage capacitor C1 is disposed on one side of the second gate insulating layer 320 far away from the substrate 100. The first pole C1$a$ and the second pole C1$b$ are separated by the second gate insulating layer 320. One side of the second pole C1$b$ away from the substrate 100 is covered with the first buffer layer 210 and the interlayer dielectric layer 400 in sequence.

The other 12 of the first source and the first drain is electrically connected to the second pole C1$b$ through a via-hole formed in the first buffer layer 210 and the interlayer dielectric layer 400. Of course, the second pole C1$b$ may be indirectly electrically connected to the cathode of the photodiode D1 through the other 12 of the first source and the first drain.

In addition, a light guiding layer 700 is disposed on one side of the photodiode D1 away from the first buffer layer 210. The light guiding layer 700 may increase the amount of light received by the photodiode D1 on the anode side, thereby improving the photoelectric conversion performance of the photodiode D1. The light guiding layer 700 may be indium tin oxide, indium zinc oxide, or other materials known to those skilled in the art.

The first passivation layer 510 covers the sides, which are away from the first buffer layer 210, of one 11 of the first source and the first drain and of the other 12 of the first source and the first drain. The first passivation layer 510 may effectively protect each structural layer located between the first passivation layer 510 and the substrate 100, improving the structural stability of the photosensitive circuit structure. One side of the first passivation layer 510 away from the first buffer layer 210 is provided with a planarization layer 600 which covers one 31 of the second source and the second drain and the other 32 of the second source and the second drain. The setting of the planarization layer 600 may reduce the difficulty of setting one 31 of the second source and the second drain and the other 32 of the second source and the second drain. Further, one side of the planarization layer 600 away from the first buffer layer 210 is provided with a second passivation layer 52 which covers one side of the light guiding layer 700 away from the first buffer layer 210. The second passivation layer 520 may protect each structural layer located between the second passivation layer 520 and the substrate 100. Since one 31 of the second source and the second drain and the other 32 of the second source and the second drain are located at one side of the first passivation layer 510 away from the substrate 100, the second passivation layer 520 may further protect one 31 of the second source and the second drain and the other 32 of the second source and a second drain. The material of the first passivation layer 510 and the second passivation layer 520 may be selected from any one of silicon oxide, silicon oxynitride, and silicon nitride, or a combination thereof. The material of the planarization layer may be a resin or other materials known to those skilled in the art.

A third buffer layer 230 and a fourth buffer layer 240 may be disposed on the substrate 100, the third buffer layer 230 is located on one side of the fourth buffer layer 240 away from the substrate 100, and the ground GND may be disposed between the third buffer layer 230 and the fourth buffer layer 240. The second buffer layer 220 is located on one side of the third buffer layer 230 away from the substrate 100. The other 32 of the second source and the second drain is electrically connected to the ground GND through a via-hole penetrating through the first passivation layer 510, the interlayer dielectric layer 400, the first buffer layer 210, the second gate insulating layer 320, the second buffer layer 220 and the third buffer layer 230. The second buffer layer 220, the third buffer layer 230, and the fourth buffer layer 240 may be made of the same material as the first buffer layer 210, which is not repeated herein.

On the basis of the above, an embodiment of the present application also provides an optical device, including a substrate and a plurality of photosensitive circuit structures which are disposed on the substrate in an array. The photosensitive circuit structure is the same as the photosensitive circuit structure described above, and may bring the same or similar technical effects. For details, please refer to the descriptions above, which will not be repeated here.

In one implementation, the optical device provided by the embodiment of the present application may be a medical flat panel detector or the like. The optical device includes a substrate and a plurality of photosensitive circuit structure disposed on the substrate in an array to form a photosensitive flat plate. The periphery of the photosensitive flat plate is provided with a power supply line, a control signal line, a reset signal line and a reverse bias voltage line, etc., which are electrically connected to the photosensitive circuit structures correspondingly. The surface of the photosensitive flat plate is provided with a coating capable of converting rays into visible light, for example, a fluorescent film or a flash film, so that the photosensitive plate may realize its own function. The optical device may further include a radiation emitter, which may be, for example, an X-ray emitter.

During specific application, the ray emitter may be disposed opposite to the photosensitive flat plate, and an object to be detected may be located between the ray emitter and the photosensitive flat plate. Rays emitted by the ray emitter pass through the object to be detected and are received by the photosensitive plate. The coating on the surface of the photosensitive plate may convert the received rays into visible light, which may be processed by the photosensitive circuit structure that constitutes the photosensitive plate and finally form an image. The high signal to noise ratio of the photosensitive circuit structure is conducive to improving the quality of the image generated by the optical device.

In other possible implementations, the optical device provided by embodiments of the present application may also be an optical fingerprint sensor, and may also be other optical devices that require the application of a photosensitive circuit structure.

Finally, it should be noted that the foregoing embodiments are merely intended for describing the technical solutions of the present application other than limiting the present application. Although the present application is illustrated in detail with reference to the foregoing embodiments, persons of ordinary skill in the art should understand that they may still make modifications to the technical solutions described in the foregoing embodiments or equivalent substitutions to some or all of the technical features thereof, and these modifications or substitutions will not make the essence of the corresponding technical solutions deviate from the scope of the technical solutions of embodiments of the present application.

What is claimed is:

1. A photosensitive circuit structure, comprising:
   a photosensitive unit comprising a photodiode and a reset transistor;
   a signal amplification unit comprising an amplification transistor; and
   a control unit comprising a control transistor;
   wherein, an input terminal of the reset transistor is electrically connected to a power supply terminal, an output terminal of the reset transistor is electrically connected to a control terminal of the amplification transistor, and a control terminal of the reset transistor is electrically connected to a reset signal terminal; an input terminal of the amplification transistor is electrically connected to the power supply terminal, an output terminal of the amplification transistor is electrically connected to an input terminal of the control transistor, and a control terminal of the control transistor is electrically connected to a signal control terminal;
   a drain current of the reset transistor is smaller than a drain current of the amplification transistor, and a drain current of the control transistor is smaller than the drain current of the amplification transistor; and
   a carrier mobility of the reset transistor is smaller than a carrier mobility of the amplification transistor, and the carrier mobility of the reset transistor is smaller than a carrier mobility of the control transistor.

2. The photosensitive circuit structure according to claim 1, wherein an anode of the photodiode is electrically connected to a reverse bias voltage terminal, and a cathode of the photodiode is electrically connected between the output terminal of the reset transistor and the control terminal of the amplification transistor; and
   the photosensitive unit further comprises a storage capacitor, a first pole of the storage capacitor is electrically connected to the anode of the photodiode, and a second pole of the storage capacitor is electrically connected to the cathode of the photodiode.

3. The photosensitive circuit structure according to claim 1, further comprising an operational amplification unit, wherein the output terminal of the control unit is electrically connected to an input terminal of the operational amplification unit.

4. The photosensitive circuit structure according to claim 3, wherein the photosensitive circuit structure further comprises a voltage division unit, an input terminal of the voltage division unit is electrically connected between the output terminal of the control unit and the input terminal of the operational amplification unit, and an output terminal of the voltage division unit is electrically connected to a ground.

5. The photosensitive circuit structure according to claim 3, wherein the operational amplification unit comprises an operational amplifier, a capacitor, an adjustable capacitor, and a correlated double sampling circuit, the capacitor is electrically connected between the output terminal of the control unit and an inverting input terminal of the operational amplifier, a positive going input terminal of the operational amplifier is electrically connected to a reference input terminal, an output terminal of the operational amplifier is electrically connected to the correlated double sampling circuit, and the adjustable capacitor is electrically connected between the inverting input terminal of the operational amplifier and the output terminal of the operational amplifier.

6. The photosensitive circuit structure according to claim 1, wherein the reset transistor is a metal oxide transistor or an amorphous silicon transistor;
the amplification transistor is one of a low-temperature polysilicon transistor, a high-mobility metal oxide transistor, a silicon carbide transistor and a carbon nanotube transistor; and
the control transistor is one of a N-type high-mobility metal oxide transistor, a P-type low-temperature polysilicon transistor and a P-type carbon nanotube transistor.

7. The photosensitive circuit structure according to claim 1, wherein an active layer of the reset transistor comprises at least one of indium gallium zinc oxide and indium tin zinc oxide; and
at least one of an active layer of the amplification transistor and an active layer of the control transistor comprises at least one of ITZO, IGXO, and polycrystalline IGZO, wherein X is a copper-aluminum alloy.

8. The photosensitive circuit structure according to claim 1, wherein the photosensitive circuit structure comprises at least two buffer layers; at least two of three active layers respectively comprised in the reset transistor, the amplification transistor and the control transistor are different from each other, and are respectively located on the at least two buffer layers.

9. The photosensitive circuit structure according to claim 8, wherein the at least two buffer layers comprise a first buffer layer and a second buffer layer, and the reset transistor is disposed on the first buffer layer;
the second buffer layer is located at one side of the first buffer layer away from the reset transistor, and at least one of the control transistor and the amplification transistor is disposed on the second buffer layer; and
a distance is disposed between an orthogonal projection of the reset transistor on the second buffer layer and an orthogonal projection of the amplification transistor on the second buffer layer; or, a distance is disposed between an orthogonal projection of the reset transistor on the second buffer layer and an orthogonal projection of the control transistor on the second buffer layer.

10. The photosensitive circuit structure according to claim 9, wherein the reset transistor comprises a first source, a first drain, a first gate, and a first active layer disposed on the first buffer layer; the first source and the first drain are each electrically connected to the first active layer; one of the first source and the first drain is an input terminal of the reset transistor, and the other one of the first source and the first drain is an output terminal of the reset transistor; a cathode of the photodiode is electrically connected to the other one of the first source and the first drain; and a first gate insulating layer is disposed between the first gate and a first active layer;
at least one of the amplification transistor and the control transistor comprises a second source, a second drain, a second gate, and a second active layer disposed on the second buffer layer; the second source and the second drain are each electrically connected to the second active layer, one of the second source and the second drain is an input terminal of at least one of the amplification transistor and the control transistor, and the other of the second source and the second drain is an output terminal of at least one of the amplification transistor and the control transistor; and a second gate insulating layer is disposed between the second gate and the second active layer; and
an interlayer dielectric layer is disposed on one side of the first active layer and one side of the first gate that are away from the first buffer layer, and a first passivation layer is further disposed on one side of the interlayer dielectric layer away from the second buffer layer.

11. The photosensitive circuit structure according to claim 10, wherein the photodiode is disposed on one side of the interlayer dielectric layer away from the first buffer layer, and a light guiding layer is disposed on one side of the photodiode away from the first buffer layer; and
a planarization layer and a second passivation layer are disposed on one side of the first passivation layer away from the first buffer layer in sequence, and the second passivation layer covers one side of the light guiding layer away from the first buffer layer.

12. The photosensitive circuit structure according to claim 10, wherein the cathode of the photodiode directly is contacted with one of the first source and the first drain.

13. The photosensitive circuit structure according to claim 10, wherein the interlayer dielectric layer is provided with a first groove and a second groove, both the first groove and the second groove penetrate through the interlayer dielectric layer along a thickness direction of the buffer layer, one of the first source and the first drain is electrically connected to the first active layer through the first groove, and the other of the first source and the first drain is electrically connected to the first active layer through the second groove.

14. The photosensitive circuit structure according to claim 13, wherein the first groove and the second groove are disposed at an interval along an extension direction of the buffer layer.

15. The photosensitive circuit structure according to claim 10, wherein at least one of the control transistor and the amplification transistor comprises a third groove and a fourth groove; both the third groove and the fourth groove penetrate through the first passivation layer, the interlayer dielectric layer, the first buffer layer, and the second gate insulating layer along a thickness direction of the buffer layer; one of the second source and the second drain is electrically connected to the second active layer through the third groove; and the other of the second source and the second drain is electrically connected to the second active layer through the fourth groove.

16. The photosensitive circuit structure according to claim 15, wherein the third groove and the fourth groove are disposed at an interval along an extension direction of the buffer layer.

17. The photosensitive circuit structure according to claim 8, wherein the at least two buffer layers comprise three buffer layers stacked along a thickness direction of the buffer layer, and the three active layers of the reset transistor, the control transistor, and the amplification transistor are respectively located on the three buffer layers.

18. The photosensitive circuit structure according to claim 1, wherein the drain current of the reset transistor is smaller than the drain current of the control transistor.

19. The photosensitive circuit structure according to claim 1, wherein the carrier mobility of the amplification transistor is greater than the carrier mobility of the control transistor; or, the carrier mobility of the amplification transistor is smaller than the carrier mobility of the control transistor.

20. An optical device, comprising a substrate and a plurality of photosensitive circuit structures according to claim 1, wherein the plurality of photosensitive circuit structures are disposed on the substrate in an array.

\* \* \* \* \*